United States Patent
Sayka

[19]

[11] Patent Number: 5,772,769
[45] Date of Patent: Jun. 30, 1998

[54] APPARATUS FOR COATING A WORKPIECE WITH FLUID CONTAMINATION DETECTION

[75] Inventor: Anthony Sayka, San Antonio, Tex.

[73] Assignee: VLSI Technology, Inc., San Jose, Calif.

[21] Appl. No.: 698,950

[22] Filed: Aug. 16, 1996

Related U.S. Application Data

[60] Continuation of Ser. No. 471,649, Jun. 5, 1995, Pat. No. 5,558,902, which is a division of Ser. No. 250,659, May 27, 1994, Pat. No. 5,509,375, which is a continuation of Ser. No. 902,119, Jun. 22, 1992, abandoned.

[51] Int. Cl.[6] ............... B05C 11/00; B05C 5/00; B05B 13/02
[52] U.S. Cl. ............ 118/712; 118/688; 118/319; 356/337
[58] Field of Search ............. 118/712, 319; 356/337, 338, 436, 441, 442, 73.1; 250/222.2, 301, 432 R; 73/61.71

[56] References Cited

U.S. PATENT DOCUMENTS

| | | | |
|---|---|---|---|
| 3,586,862 | 6/1971 | Topol | 250/218 |
| 3,713,743 | 1/1973 | Simms | 356/338 |
| 4,637,729 | 1/1987 | Schoch | 356/410 |
| 4,710,643 | 12/1987 | Schmukler et al. | 356/442 |
| 5,033,851 | 7/1991 | Sommer | 356/436 |
| 5,033,858 | 7/1991 | Twerdochlib et al. | 356/436 |
| 5,106,187 | 4/1992 | Bezanson | 356/337 |
| 5,127,362 | 7/1992 | Iwatsu | 118/712 |
| 5,134,962 | 8/1992 | Amada et al. | 118/688 |
| 5,217,910 | 6/1993 | Shimizu et al. | 437/35 |
| 5,250,116 | 10/1993 | Tanimoto | 118/712 |
| 5,270,227 | 12/1993 | Kameyama et al. | 437/35 |
| 5,281,557 | 1/1994 | Yu | 437/235 |

FOREIGN PATENT DOCUMENTS

| | | | |
|---|---|---|---|
| 62-261031 | 11/1987 | Japan . | |
| 63-37235 | 2/1988 | Japan | 356/337 |
| 63-231243 | 9/1988 | Japan | 356/337 |

Primary Examiner—Donald E. Czaja
Assistant Examiner—Calvin Padgett
Attorney, Agent, or Firm—Hickman & Martine, LLP

[57] ABSTRACT

A coating apparatus for detecting the presence of contaminants carried by a liquid a is that is applied as a coating on a workpiece. A tube guides the liquid along a flow path to the workpiece. A light source illuminates the liquid along the flow path with an optical fiber or other light carrier, and light is scattered by any contaminants present in the liquid. Light scattered by the contaminant particles is more intense than light scattered by the other liquid particles, and this brighter scattered light is detected by a light detector positioned adjacent to the fluid flow path. The coating system is particularly well suited for use in a spin-on coating process that applies a liquid, such as a photoresist material or a dielectric material, to a semiconductor wafer or other workpiece that is secured to a rotating turntable and rotated to receive a coating of the liquid.

13 Claims, 6 Drawing Sheets

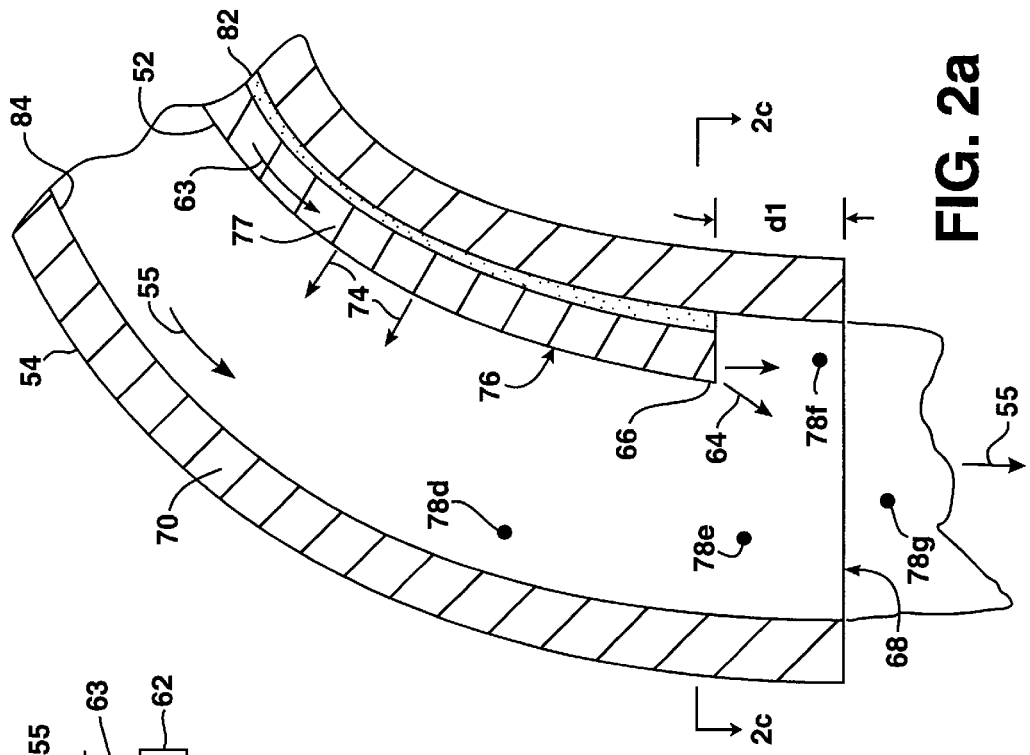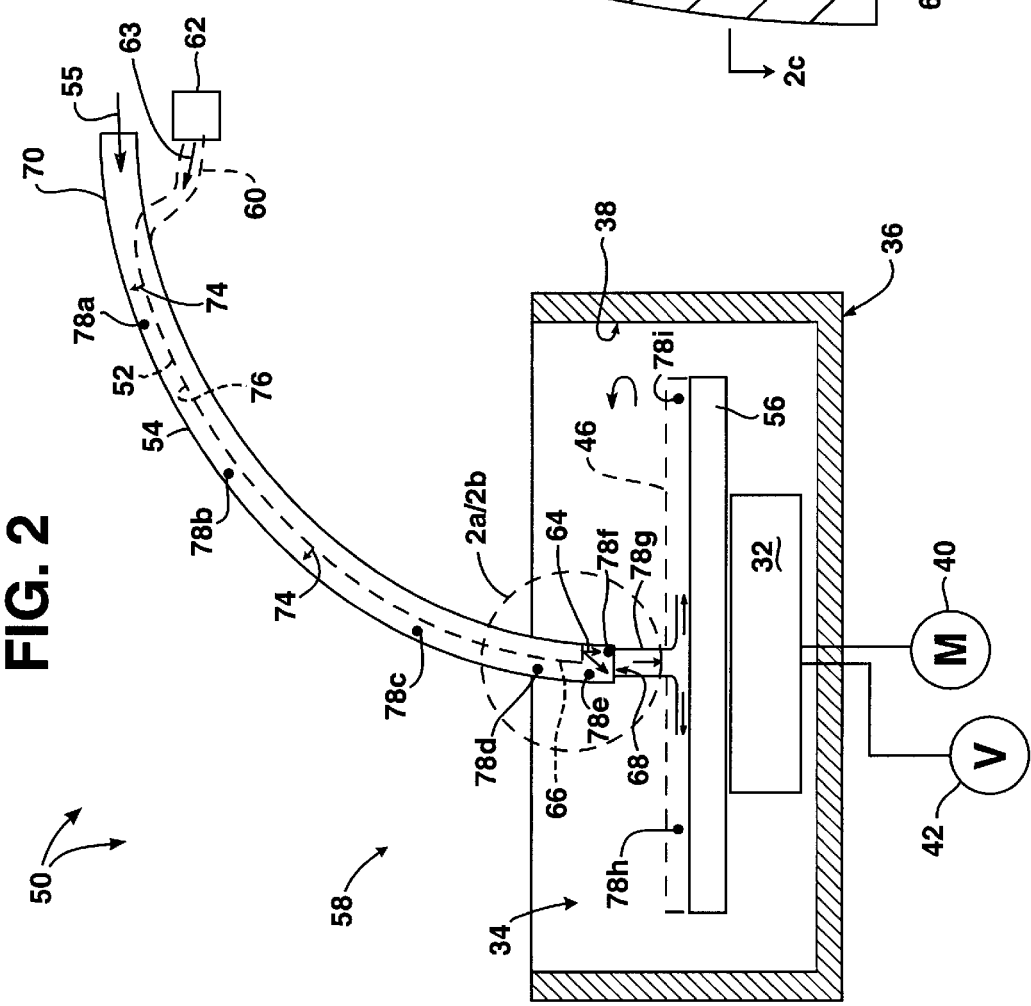

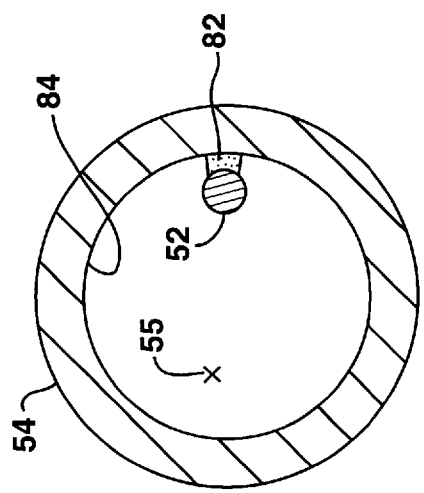
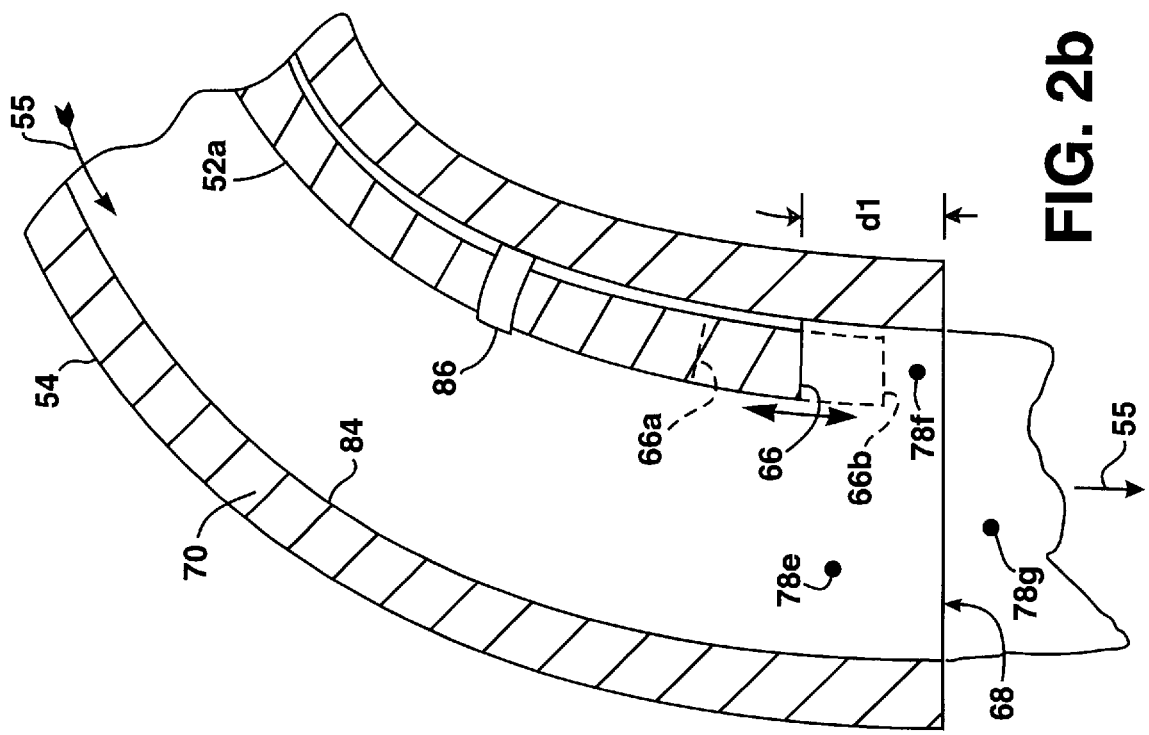

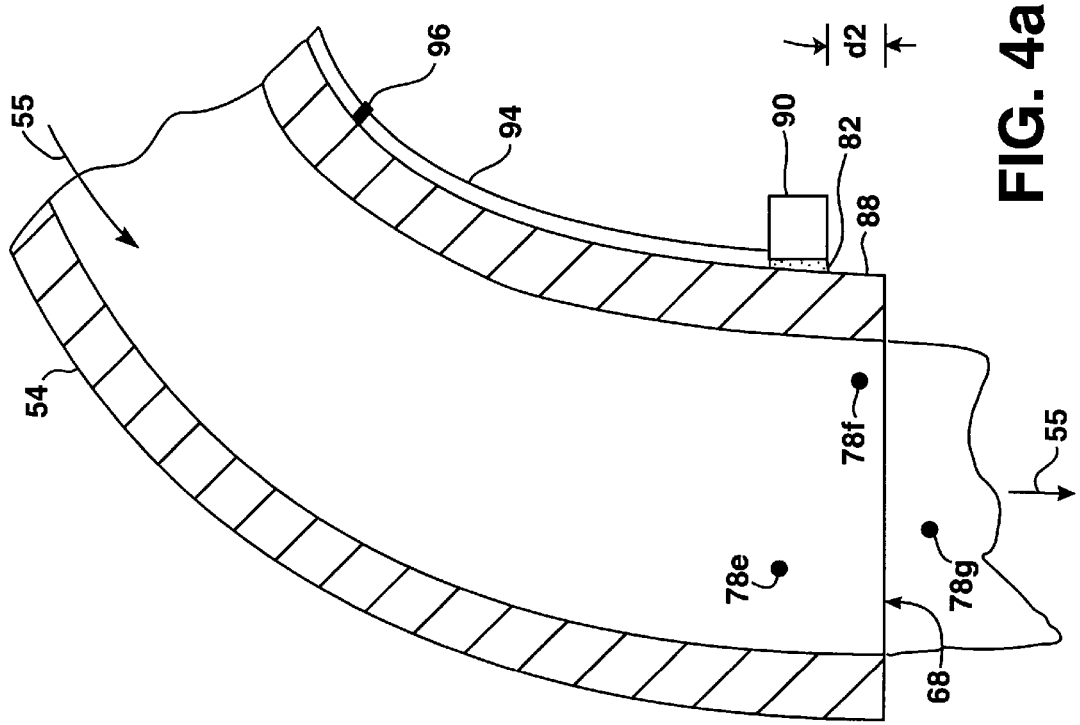
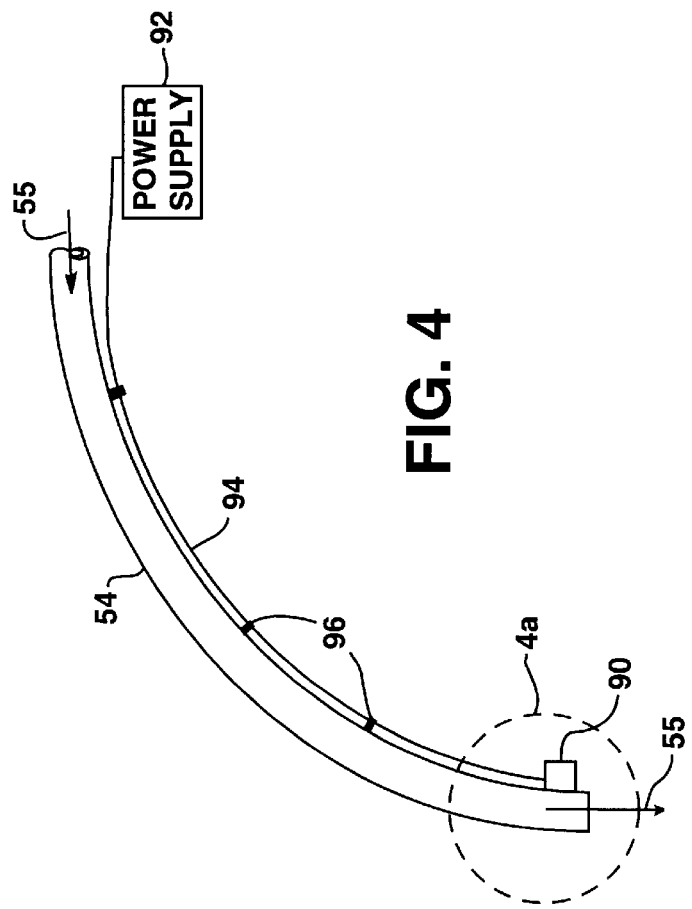

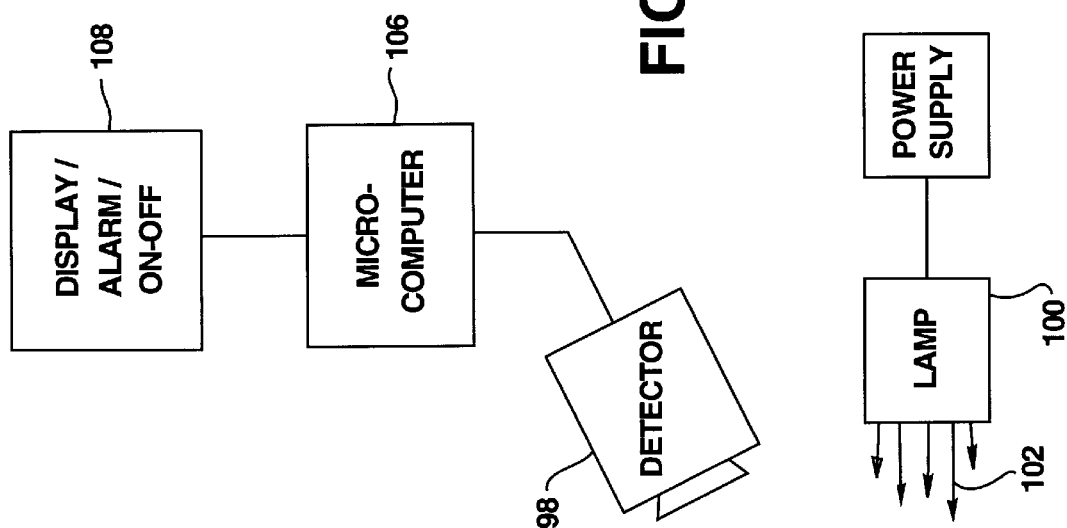
FIG. 5
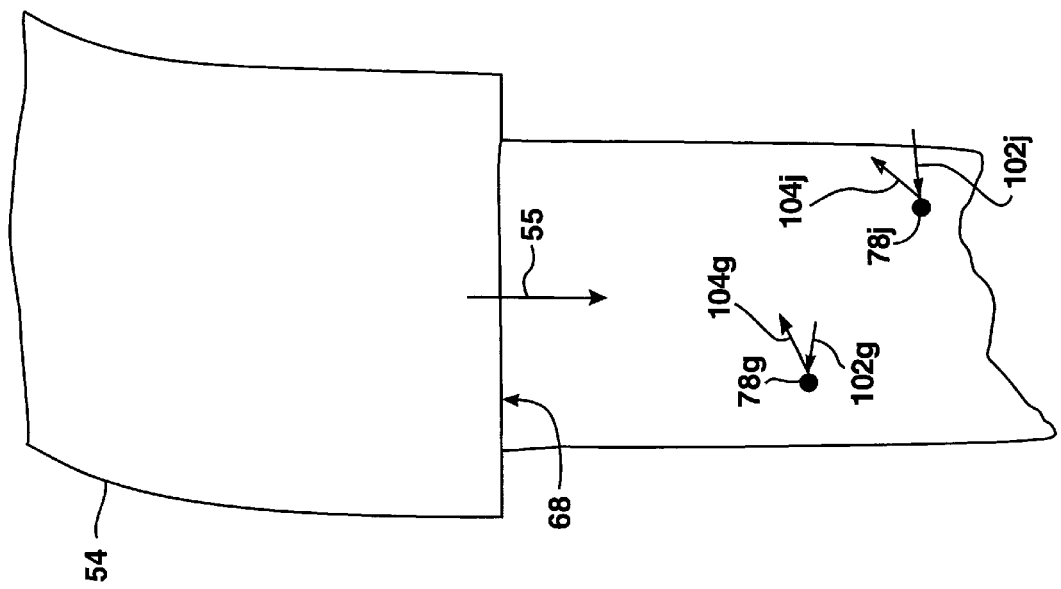

5,772,769

APPARATUS FOR COATING A WORKPIECE WITH FLUID CONTAMINATION DETECTION

This is a continuation of U.S. Ser. No. 08/471,649 filed on Jun. 5, 1995, now U.S. Pat. No. 5,558,902, which is a divisional application of Ser. No. 08/250,659 filed on May 27, 1994, now U.S. Pat. No. 5,509,375, which is a continuation of U.S. application Ser. No. 07/902,119 filed Jun. 22, 1992, now abandoned.

BACKGROUND OF THE INVENTION

1. Field of the Invention

The field of this invention relates to application of fluids in industrial fabrication processes, and more particularly to techniques for detecting the presence of contaminants carried in a fluid that is applied to semiconductor wafers during integrated circuit fabrication.

2. Background of the Technical Art

FIG. 1 shows a prior art approach now in use. A spin-on coating (SOC) machine 10 applies a fluid, here a liquid, to a semiconductor wafer undergoing processing. The particular coating machine described here is selected from among the Photoresist Coaters 8300 Series that are manufactured and sold by Silicon Valley Group, Inc. of San Jose, Calif., USA.

The SOC machine 10 includes a process liquid bottle 12, connected as a source to supply liquid through a first tube 14, a pump 16 and a second tube 18 to a local process worksite 20. The bottle 12 is usually sealed inside an airtight chamber 22 within a housing 24 to isolate a process liquid 26a inside the bottle 12 from the ambient environment, typically air. For this discussion, the process liquid 26a, 26b, 26c is present at particular locations in the pump 16 and first and second tubes 14 and 18. Air or other contaminants can mix with process liquids, such as certain liquid solvent-photoresist combinations and particular liquid dielectrics, and form contaminants that degrade the suitability of the liquid for wafer processing.

The pump 16 responds to instructions received from a controller 28 to pump liquid 26a from the bottle 12 as required for the SOC process being performed. The particular liquid volume of a dose will be variable and dependent on such details as the type of process liquid being applied, the thickness of a layer to be formed on a workpiece at the worksite 20, and the surface area of the workpiece that is to be covered with the liquid.

The pump 16 moves a dose of liquid 26b through a first tube 14, through the pump 16, and through a second tube 18 for dispensing the liquid through a tube outlet 30 placed adjacent to the worksite 20. A tube outlet 30, sometimes referred to as a nozzle, is positioned at the end of the second tube 18 to control liquid outflow from this tube. Tubes 14 and 18 are typically made with an opaque or mildly translucent material that is flexible so the tubes can bend during semiconductor processing.

At the worksite 20, a turntable 32 is mounted to spin inside a chamber that is defined by a cylinder 36 having a vertically extending splash wall 38. A motor 40 is connected to rotate the turntable 32. A vacuum pump 42 is also coupled to the turntable 32 to generate a sub-ambient pressure at the top surface of the turntable. As a result, the turntable 32 functions as a vacuum chuck, which pulls the backside of an adjacent workpiece 44 against the top surface of turntable 32 so that the workpiece and turntable spin together. Typically the turntable 32 and workpiece 44 are both circular.

During operation of a SOC process, the workpiece 44 is placed onto turntable 32. The vacuum pump 42 is activated to evacuate air from the space between the workpiece 44 and turntable 32, to thereby clamp the workpiece to the turntable. The motor 40 spins the turntable 32, accelerating the turntable and the workpiece 44 to a desired rotational speed ranging broadly from about 1000 rpm up to 8000 rpm, depending on the particular process performed and the number of rotational steps involved in that process.

While the workpiece 44 spins, liquid 26c emerging through tube outlet 30 is received at about the center of the workpiece, as indicated by the liquid 26c. Centrifugal forces immediately disperse the liquid 26c in a circular pattern, causing the liquid to expand radially toward the circumference of the workpiece 44. The liquid 26c quickly forms a new layer 46 having approximately uniform thickness that overlies the top of workpiece 44.

To minimize fouling and contamination of the turntable 32 and the workpiece 44 by excess process liquid, the worksite 20 is designed so that excess liquid is thrown beyond the circumference of the spinning workpiece 4 This excess liquid hits the splash wall 38 and flows down to the bottom surface of the chamber 34.

In another embodiment that minimizes contamination by excess liquid, the diameter of the turntable 32 is made smaller than the diameter of the workpiece 44. However, in the current art, excess liquid cannot flow down the circumference of the workpiece 44 and onto the turntable 32, which is an advantage.

Despite the usefulness of prior art coating devices, certain drawbacks and deficiencies are known to exist with these devices. In particular, a contamination problem persists. Contaminants carried by a liquid aggregate in the coating layer 46 on the workpiece 44 can often degrade the characteristics of the finished workpiece to the point that the workpiece must be reworked or even scrapped. Both remedies are expensive and time-consuming.

Contaminants 48, shown as 48a, 48b, 48c in FIG. 1, are typically present throughout the entire flowpath of the liquid 26, beginning with contaminants 48a within the liquid 26a inside the bottle 12, continuing through the flowing liquid, and forming part of the coating layer 46 on the workpiece 44. The prior art relies on visual inspection of liquid, such as 26c, and of the workpiece 44 at ambient light intensity to find entrained contaminants 48. However, ambient light does not provide sufficient illumination for the contaminants 48 to be easily seen, and many are missed.

Further, visual inspection is done relatively late in the SOC process, generally after a contaminant is already incorporated into the workpiece.

What is needed is an approach for quickly and reliably detecting the presence of contaminants carried in a flowing liquid to minimize damage done to a workpiece to which the liquid is applied.

These needs are met by an apparatus of the present invention that directs a fluid along a flow path, such as a tube, to a workpiece that receives the liquid. The fluid may be a process liquid, such as photoresist or dielectric, that is to be applied to a semiconductor wafer or other workpiece. The liquid is illuminated along the flow path with an optical fiber or other light carrier to illuminate contaminant particles carried by the liquid. For example, the light radiating from a sidewall of an optical fiber can illuminate the liquid. The liquid may be illuminated at multiple locations in the flow path. When flowed through a tube, the liquid can be illuminated from inside the tube or from outside the tube. A light detector detects contaminant particles in the liquid by detecting light scattered by the contaminant particles. The workpiece can be rotated at a selected rotational velocity in a selected plane as the workpiece receives the liquid to provide a coating of the liquid on the workpiece.

BRIEF DESCRIPTION OF THE DRAWINGS

FIG. 2 is a schematic elevation view of a first embodiment of a spin-on coating system, constructed according to this invention, where an optical fiber is positioned inside a tube that dispenses liquid for coating the workpiece.

FIG. 2a is an enlarged cutaway side view, taken along a line defining a circle 2a/2b in FIG. 2, with an optical fiber attached to the inside of the liquid dispenser tube.

FIG. 2b is an enlarged cutaway side view, taken along a line defining a circle 2a/2b in FIG. 2, with an optical fiber mounted to slide inside the liquid dispenser tube.

FIG. 2c is a top cross-section view of the embodiment shown in FIG. 2a, taken along line 2c—2c.

FIG. 4 is a schematic elevation view of a third embodiment of a spin-on coating system, constructed according to this invention, where a light source such as a light emitting diode that is electrically coupled to a power supply, is attached to the outside of the liquid dispenser tube.

FIG. 4a is an enlarged cutaway side view, taken along a line defining a circle 4a in FIG. 4, with the light emitting diode attached to the outside of the liquid dispenser tube.

FIG. 5 is an enlarged schematic side elevation view of a fourth embodiment according to this invention, where a lamp illuminates liquid issuing from the tube outlet and a detector receives light scattered from this liquid.

DETAILED DESCRIPTION OF THE PREFERRED EMBODIMENTS

Figure 1:
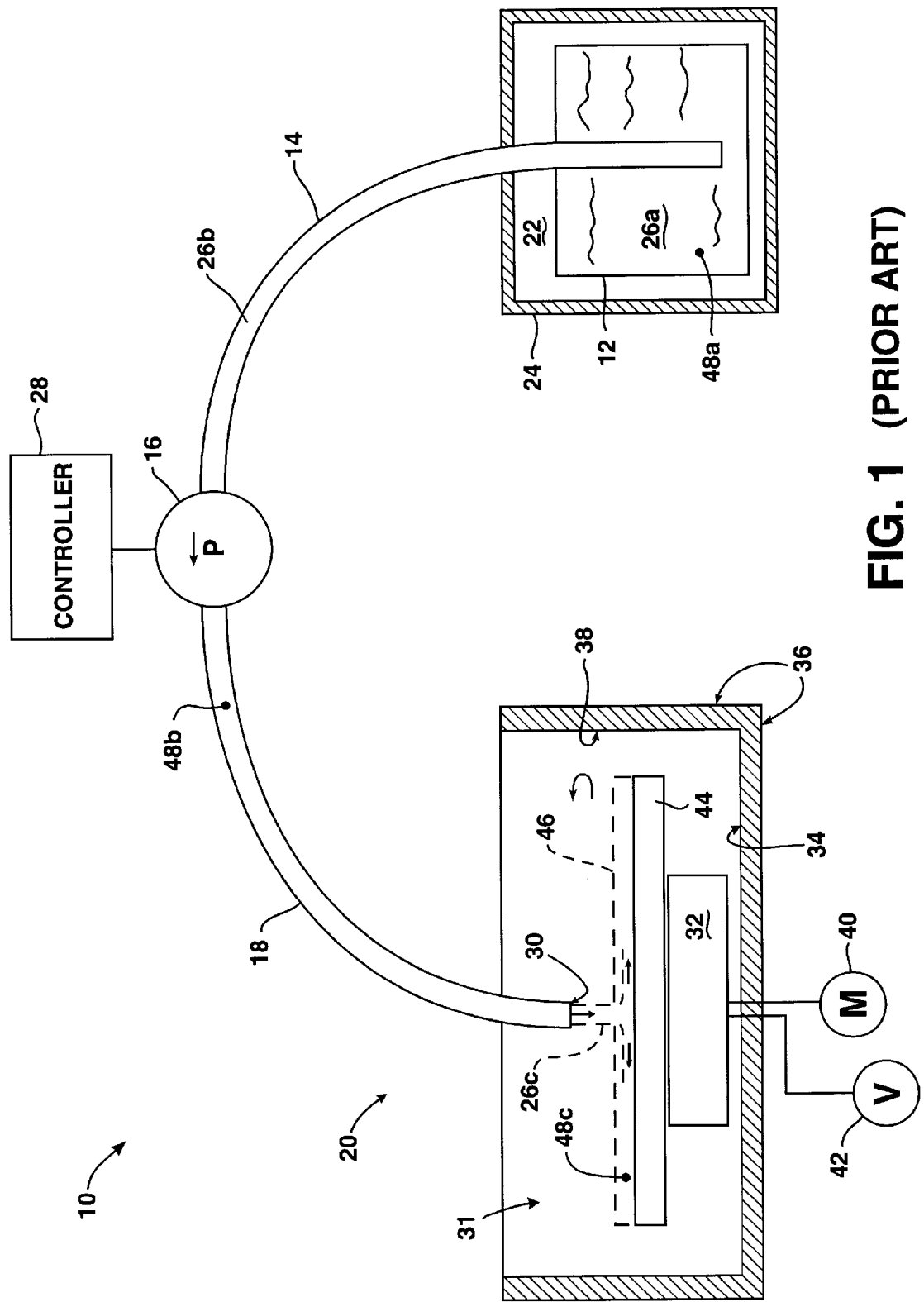
FIG. 1 is a schematic elevation view of a spin-on coating machine, constructed according to the prior art, for coating a liquid onto a workpiece supported by a turntable.

In FIGS. 2 and 2a, a spin-on coating process system 50, constructed in accordance with the invention, includes an optical fiber 52 mounted inside a tube 54 for directing a fluid, such as a liquid 55, along a flowpath within the tube onto a workpiece 56 located at a worksite 58. The present invention provides early and reliable determination of the presence of contaminants carried by the liquid 55.

In FIGS. 2 and 2a, the tube 54 is similar to the second tube 18 of FIG. 1, except that the optical fiber 52 is added. The cross-section of the tubes 54 is typically circular. The fiber 52 at a first fiber end 60 is coupled to a light source 62 to provide light that propagates within the fiber as a beam of light rays 63, as illustrated in FIG. 2a. The fiber 52 may be fabricated so that light 63 propagates within the fiber and emerges as illuminating light 64 from a second fiber end 66, terminated adjacent to an outlet 68 of the tube 54. The tube outlet 68 is positioned adjacent to the workpiece 56 in FIG. 2. To position fiber 52 inside tube 54, the fiber penetrates a wall 70 of the tube adjacent to the first end of the fiber.

The optical fiber 52 of this embodiment can be encased within a fiber sheath (not shown), to protect the fiber from a corrosive fluid or to improve the fiber's optical performance. Alternatively, the fiber 52 can be bundled with other similar optical fibers (not shown) if desired. When the second fiber end 66 is positioned as desired at a distance d1 upstream from the tube outlet 68, an adhesive 82 secures the fiber 52 to an interior wall 84 of the tube 54. In FIG. 2a, the second fiber end 66 is positioned a distance d1 from the tube outlet 68 and within the tube 54. Beyond the second fiber end 66, contaminants are illuminated by light issuing from the fiber 52.

According to another embodiment, illustrated in FIG. 2a, the fiber 52 is fabricated so that the light radiates outward as light 74 from a fiber sidewall 76 into the liquid 55, rather than at the fiber second end 66, within the interior of the tube 54. For example, design of the fiber 52 can be adjusted by changing the indices of refraction of the inner wall of the second fiber end 66 and of the core and/or cladding materials for the optical fiber 52. The resulting optical fiber will not allow light to exit from the second fiber end 66, but will allow light to penetrate radially outward through the fiber cladding 77 of the fiber 52 (FIG. 2a). This illumination can be done at any point selected along the fiber 52 within the tube 54, if the fiber is fabricated to radiate light 74 from its sidewall. A sheath (not shown) that might otherwise cover the fiber sidewall 76 is removed so that light 74 is freely transmitted radially outward through the fiber sidewall 76. This embodiment is attractive because it can be used anywhere along the fluid flowpath. The present invention thus illuminates the liquid in the flow path to illuminate contaminant particles carried by the liquid at multiple locations in the flow path, as shown by light 74 in FIG. 2.

Contaminants, if present, are randomly distributed through the flowpath of the fluid, for example as shown by the locations of contaminants 78a–78j. In FIG. 2, the flowpath shown for the liquid 55 extends to a spinning workpiece 56, where the liquid is radially dispersed. To allow viewing of contaminants 78a, 78b, etc. within the tube 54, the tube is preferably transparent, or is least sufficiently translucent that a contaminant is visible through the tube wall 70.

FIG. 2b, shows an embodiment wherein a circular, hollow sleeve 86 is secured to the tube's interior wall 84 for slidably receiving a fiber 52a.

The standoff distance d1 of the fiber second end 66b from the tube outlet 68 can be adjusted as desired. The standoff distance d1 is influenced by such factors as the type of liquid 55 to be applied to the workpiece, the degree of transparency of the liquid 55, and the height above the workpiece 56 (FIG. 2) at which tube outlet 68 will dispense liquid onto the workpiece (not shown in FIG. 2b).

For example, photoresist liquids 55 often have a dark color or are opaque, thus impeding the transmission of light; contaminants carried in such a photoresist are therefore difficult, if not impossible, to see. For dark liquids, the fiber 52a can be moved so that fiber second end 66b illuminates the liquid 55 from a smaller distance d1. By contrast, dielectric liquids 55 for forming a spin-on glass coating, for example, a silicon dioxide dielectric layer, often have a lighter color. Because such liquids transmit a higher percentage of incident light, contaminants in the liquid can be seen sooner, and the fiber second end 66b can be placed at a greater distance d1 from tube outlet 68 and still allow sufficient time to detect contaminants present in the flowing liquid.

FIG. 2c is a cross-sectional top view of the embodiment shown in FIG. 2a taken along line 2c—2c, looking downstream as the liquid 55 moves toward the workpiece (not shown in FIG. 2c). A similar cross-section can be taken from FIG. 2b as long as it is taken behind the fiber second end 66b. However, the cross-section of FIG. 2b will omit the fiber adhesive 82 and will include a sleeve 86 in its place.

Figure 3A:
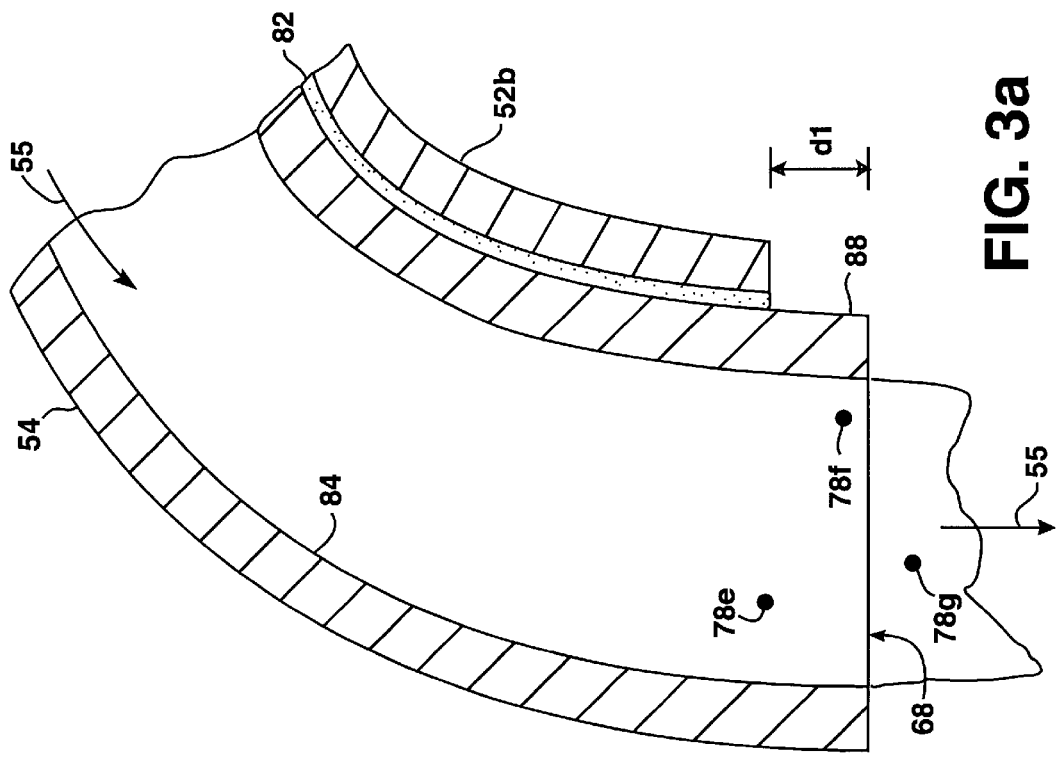
FIG. 3a is an enlarged cutaway side view taken along a line defining a circle 3a in FIG. 3, with an optical fiber attached to the outside of the liquid dispenser tube.
Figure 3:
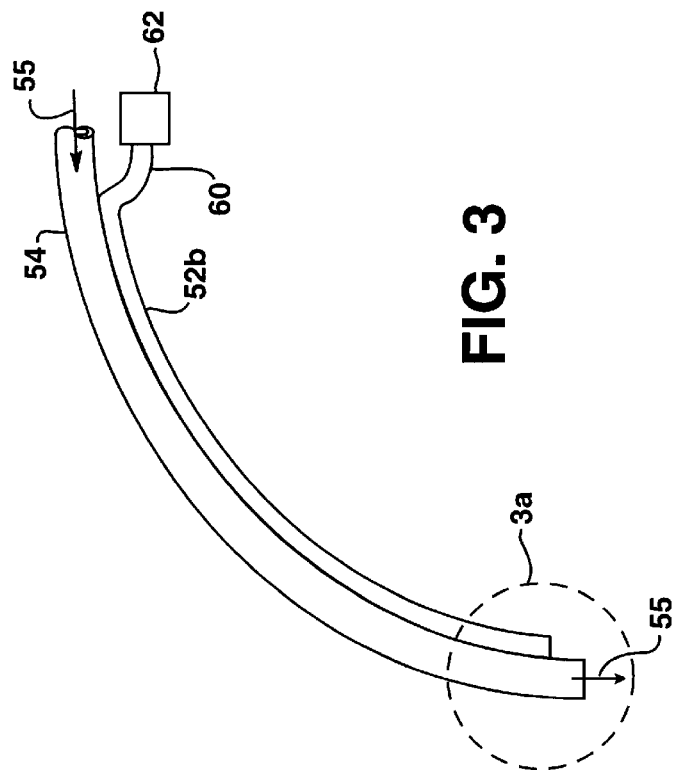
FIG. 3 is a schematic elevation view of a second embodiment of a spin-on coating system, constructed according to this invention, where an optical fiber is positioned outside a tube that dispenses a liquid for coating the workpiece.

FIGS. 3 and 3a illustrate another embodiment, which includes an optical fiber 52 that is attached with adhesive 82 to an outer wall 88 of a tube 54, at a standoff distance d1 from a tube outlet 68. Several advantages are offered by this arrangement. The fiber 52 is removed from the stream of flowing liquid 55, thereby eliminating possible source of fluid turbulence that may be unacceptable in the spin-on coating process and eliminating possible sites where contaminants could accumulate. Affixing the fiber 52 to an outer wall 88 of the tube 54 is easier than affixing the fiber to an inner wall 84, and the fiber can be more easily replaced if it malfunctions.

FIGS. 4 and 4a show another embodiment, in which an electric lamp, incandescent light or a light emitting diode 90 is secured with an attaching device such as adhesive 82 to the outer wall 88 of the tube 54. The lamp 90 is spaced apart from tube outlet 68 by a distance d2. The lamp 90 is close to the outlet to illuminate a liquid 55 and contaminants 78e, 78f and/or 78g contained in the liquid. A power supply 92 delivers power to the light source 90 through a conductor pair 94 that may attached with clamps 96 along the outer wall 88 of the tube 54.

FIG. 5 shows another embodiment including a light detector 98 operating in combination with a lamp 100 that generates and issues light rays 102 for illuminating a flowing liquid 55. Unlike the other embodiments previously described, the lamp 100 is not attached to the tube 54. A light-sensitive head of the detector 98 faces into the liquid 55 to detect light scattered from contaminants 78g and 78j, carried by liquid that would be discharged from a tube outlet 68 toward the workpiece (not shown). The contaminants 78g and 78j that scatter the incident light appear to be brighter than the adjacent liquid 55, thereby making the contaminants detectable by the detector 98. The detector 98 can, for example, include a photodetector array.

Light rays 102g and 102j are scattered by the respective contaminant particles 78g and 78j and thereby produce scattered rays 104g and 104j that are detected by the detector 98. In response, the detector 98 generates and issues detection signals that are received by a microprocessor 106 for analysis. If the detector 98 detects the presence of contaminants in the liquid 55, the microprocessor 106 issues a detection signal that is received by a display or alarm module 108 to register the presence of the contaminants. For example, the module 108 can be a visual display such as a flashing red light or a computer monitor, an audible alarm such as a bell or a horn, or an on-off switch such as a circuit breaker that, when tripped, interrupts operation of the spin-on coating process, for example by terminating flow of the liquid 55.

While this invention has been described in terms of several preferred embodiments, alterations, modifications and permutations thereof can be made without departing from the scope of the invention.

For example, the workpiece can be a different type of disc-like material other than a wafer, such as an optical glass lens, a plastic record like those formed as a compact disc for recording music or other information, or a magnetic disc for storing data. A light source can be selected for generating light lying outside the visible spectrum, such as ultraviolet or infrared light.

I claim:
1. An apparatus for delivering a coating fluid to a workpiece comprising:
    means for providing fluid to be used for coating,
    means for detecting a fluid along a flow path to said workpiece from the means for providing a fluid; said means for directing positioned to receive the fluid from said means for providing fluid; and illuminating means arranged adjacent said means for directing for illuminating the fluid at multiple locations of the fluid flow path to illuminate at least one contaminant particle carried by the fluid, said means for illuminating including an optical fiber which radiates light from a sidewall of said optical fiber.
2. The apparatus of claim 1 wherein said means for directing a fluid includes a tube having a wall portion that permits transmission of light through said wall portion, and wherein said optical fiber is positioned external to and along a length of said tube.
3. The apparatus of claim 1 further comprising means for detecting said at least one contaminant particle by detecting light scattered by said at least one contaminant particle, said means for detecting positioned relative to said means for directing to receive the light scattered by the contaminant particles.
4. The apparatus of claim 1 wherein said means for directing a fluid includes a tube, and wherein said optical fiber is positioned inside said tube.
5. An apparatus for coating a workpiece comprising:
    means for directing a liquid along a flow path, said means for directing including means for directing the liquid through a tube;
    positioning means located adjacent the workpiece for positioning the workpiece so that the workpiece receives the liquid from a tube outlet of said tube; and
    illuminating means arranged adjacent the means for directing for illuminating the liquid along the flow path to illuminate contaminant particles carried by the liquid at multiple locations in the flow path, wherein said means for illuminating the liquid along the flow path includes a means for illuminating the liquid inside the tube, said means for illuminating inside the tube including an optical fiber positioned inside said tube, said optical fiber radiating light from a sidewall of said optical fiber.
6. The apparatus of claim 5 further comprising means for rotating said workpiece at a selected rotational velocity in a selected plane as said workpiece receives said liquid to provide a coating of said liquid on said workpiece.
7. An apparatus for coating a workpiece comprising:
    means for directing a liquid along a flow path to said workpiece;
    means for positioning the workpiece so that the workpiece receives the liquid from said means for direction;
    illustrating means arranged adjacent the means for directing for illuminating the liquid along the flow path to illuminate at least one contaminant particle carried by the liquid by radiating light from a sidewall of an optical fiber which extends substantially adjacent the flow path of the liquid; and
    means for detecting said contaminant particles by detecting light scattered by said contaminant particles, said means for detecting positioned relative to said means for directing to receive the light scattered by the contaminant particles.
8. The apparatus of claim 7 further comprising means for rotating said workpiece at a selected rotational velocity in a selected plane as said workpiece receives said liquid, to provide a coating of said liquid on said workpiece.

9. The apparatus of claim 7 wherein said means for illuminating illuminates said liquid at multiple locations in said flow path.

10. The apparatus of claim 9 further comprising catching means positioned relative to said workpiece to catch, to catch liquid received by, and thrown off from, said workpiece as said workpiece is rotated.

11. The apparatus of claim 9 wherein said flow path of said liquid is in a tube, and wherein said optical fiber is positioned along a length of said tube parallel to a wall of said tube.

12. An apparatus for coating a workpiece comprising:

means for directing a liquid along a flow path, said means for directing including means for directing said liquid through a tube;

positioning means located adjacent the workpiece for positioning the workpiece so that the workpiece receives the liquid from an outlet of said tube; and illuminating means arranged adjacent said means for directing for illuminating the liquid along the flow path to illuminate contaminant particles carried by the liquid at multiple locations in the flow path, wherein said means for illuminating along the flow path includes means for illuminating the liquid from outside the tube.

13. The apparatus of claim 12 wherein said means for illuminating includes an optical fiber positioned outside said tube, wherein said optical fiber is positioned along a portion of a length of said tube.

* * * * *